US012672474B2

(12) United States Patent
Kim et al.

(10) Patent No.: US 12,672,474 B2
(45) Date of Patent: Jun. 30, 2026

(54) ORGANIC LIGHT EMITTING DISPLAY DEVICE

(71) Applicant: LG Display Co., Ltd., Seoul (KR)

(72) Inventors: MinHyung Kim, Seoul (KR); JungIm Hwang, Gimpo-si (KR); HyunSeung Kim, Seoul (KR); Seong-Il Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 367 days.

(21) Appl. No.: 18/478,137

(22) Filed: Sep. 29, 2023

(65) Prior Publication Data

US 2024/0215412 A1     Jun. 27, 2024

(30) Foreign Application Priority Data

Dec. 26, 2022     (KR) ........................ 10-2022-0185091

(51) Int. Cl.
H10K 59/80          (2023.01)
G02B 5/30          (2006.01)

(52) U.S. Cl.
CPC ....... H10K 59/8791 (2023.02); G02B 5/3008 (2013.01)

(58) Field of Classification Search
None
See application file for complete search history.

(56) References Cited

U.S. PATENT DOCUMENTS

| | | | | |
|---|---|---|---|---|
| 4,179,395 A | * | 12/1979 | Cole, Jr. ................ | C09B 35/35 |
| | | | | 252/299.1 |
| 10,401,675 B2 | | 9/2019 | Lee et al. | |
| 2005/0151896 A1 | * | 7/2005 | Hara .................... | G02B 5/3016 |
| | | | | 349/96 |
| 2010/0182543 A1 | * | 7/2010 | Goto .................. | C09K 19/3483 |
| | | | | 427/67 |
| 2015/0362799 A1 | * | 12/2015 | Kim ..................... | G02B 5/3016 |
| | | | | 349/96 |
| 2018/0059300 A1 | * | 3/2018 | Kim ......................... | G02B 1/14 |
| 2018/0212200 A1 | * | 7/2018 | Wang .................. | G02B 5/3016 |

FOREIGN PATENT DOCUMENTS

| | | |
|---|---|---|
| KR | 20110122345 A | 11/2011 |
| KR | 20180061484 A | 6/2018 |

* cited by examiner

*Primary Examiner* — Feifei Yeung Lopez
(74) *Attorney, Agent, or Firm* — Seed Intellectual Property Law Group LLP

(57)          ABSTRACT

Provided is an organic light emitting display device. The organic light emitting display device comprises a display panel; and an optical laminate disposed on the display panel and including a multi-functional layer. The multi-functional layer contains a liquid crystal mixture including a liquid crystal compound and two or more types of dichroic dyes, below the multi-functional layer, the liquid crystal compound is contained, but the two or more types of dichroic dyes are not included and above the multi-functional layer, the two or more types of dichroic layers are contained.

16 Claims, 10 Drawing Sheets

ORGANIC LIGHT EMITTING DISPLAY DEVICE

CROSS-REFERENCE TO RELATED APPLICATIONS

This application claims the priority of Korean Patent Application No. 10-2022-0185091 filed on Dec. 26, 2022, in the Korean Intellectual Property Office, the disclosure of which is incorporated herein by reference.

BACKGROUND

Technical Field

The present disclosure relates to an organic light display device.

Description of the Related Art

The organic light emitting display device (OLED) is a self-emitting display device so that a separate light source is not necessary, unlike the liquid crystal display device (LCD). Therefore, the organic light emitting display device may be manufactured to have light weight and small thickness. Further, since the organic light emitting display device is driven at a low voltage, it is advantageous not only in terms of power consumption, but also in terms of color implementation, response speed, viewing angle, and contrast ratio (CR), so that the organic light emitting display device is being studied as next generation displays.

The organic light emitting display device displays images using light emitted from the organic light emitting diode connected to the thin film transistor in each pixel area. The organic light emitting diode is an element which forms an organic emission layer formed of an organic material between an anode and a cathode and applies an electric field to emit light. The organic light emitting diode is driven at a low voltage, has a low power consumption, and is manufactured above a light and flexible substrate.

In recent years, in order to ensure the visibility by the light reflection of the outside of the organic light emitting display device, a polarizer is applied to one side surface of the organic light emitting display device.

One measure of external light visibility of the organic light emitting display device is an ambient contrast ratio (ACR) and currently, in order to improve the ACR of the organic light emitting display, a circular polarizer is applied to the organic light emitting display device.

In the case of the organic light emitting display device of the related art, after manufacturing an organic light emitting diode on a substrate on which a thin film transistor (TFT) is formed, a multi passivation layer which is formed of a plurality of organic films and inorganic films is formed thereabove as a passivation layer. A barrier film and a circular polarizer are attached thereabove by a lamination process. By doing this, an organic light emitting display device is manufactured.

In the case of the circular polarizer, a plurality of optical films is laminated to be bonded and the circular polarizer is manufactured as a film so that it is difficult to manufacture to be thin. Currently, a thin circular polarizer has a thickness of approximately 150 μm.

In the case of a plastic organic light emitting display panel which implements to be flexible by applying a circular polarizer, it is difficult to manufacture the circular polarizer to be thin. Therefore, when a low curvature which is 3R or lower is implemented, a stress generated from the circular polarizer is transmitted to an inorganic film of the multi passivation layer or an inorganic film of the thin film transistor (TFT) on the organic light emitting diode therebelow to cause the stress. Therefore, the possibility of causing the defect of the organic light emitting display device may be increased.

As the entire thickness of the organic light emitting display device to which the circular polarizer is applied is increased, there are difficulties in implementing the flexibility such as bending or folding in the organic light emitting display device. Further, the circular polarizer is very expensive to account for a large proportion of the material cost of an organic light emitting display device, so that current organic light emitting display devices are insufficient in many ways.

BRIEF SUMMARY

A benefit to be achieved by the present disclosure is to provide an organic light emitting display device with a thin thickness and a manufacturing method thereof.

Further, a benefit to be achieved by the present disclosure is to provide an organic light emitting display device with an improved supply chain management (SCM) structure by simplifying a process of manufacturing a multi-functional layer and a manufacturing method thereof.

Benefits of the present disclosure are not limited to the above-mentioned benefits, and other benefits, which are not mentioned above, can be clearly understood by those skilled in the art from the following descriptions.

In order to achieve the above-described benefits, according to an aspect of the present disclosure, an organic light emitting display device includes a display panel, and an optical laminate disposed on the display panel and including a multi-functional layer, and the multi-functional layer contains a liquid crystal mixture including a liquid crystal compound and two or more types of dichroic dyes, below the multi-functional layer, the liquid crystal compound is contained, but the two or more types of dichroic dyes are not included and above the multi-functional layer, the two or more types of dichroic layers may be contained.

Other detailed matters of the example embodiments are included in the detailed description and the drawings.

According to example embodiments of the present disclosure, an organic light emitting display device includes a multi-functional layer having both a linear polarization characteristic and a phase retardation characteristic to be implemented with an ultra-thin thickness. Further, as a total thickness is reduced, an organic light emitting display device which is advantageous for shrinkage in a reliability environment may be provided.

According to example embodiments of the present disclosure, in a display device, a process of finally laminating a linear polarizer and a phase retarder is excluded to provide an SCM structure with an improved complexity and reduce a cost of the manufacturing process.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
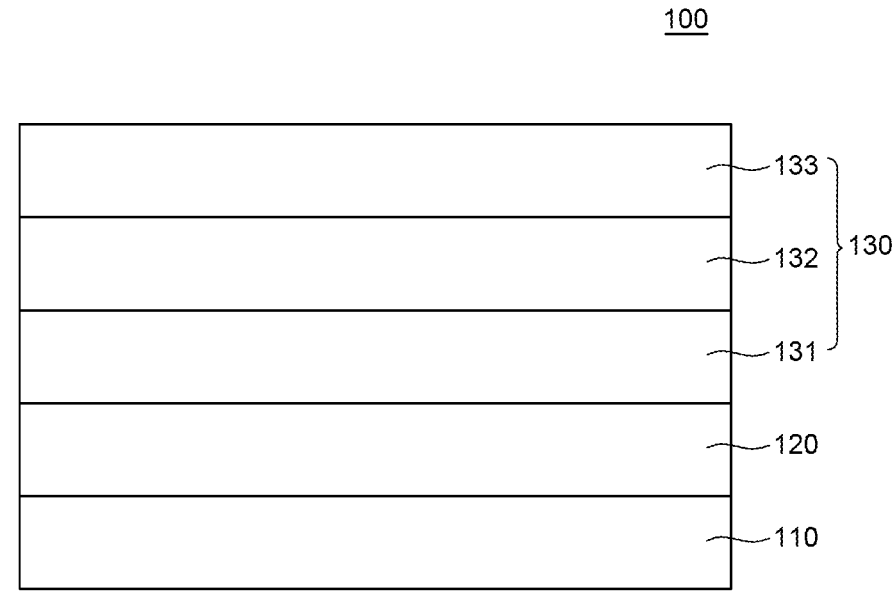
FIG. 1 is a cross-sectional view of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below" and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings.

Hereinafter, the example embodiment of the present disclosure will be described more fully hereinafter with reference to the accompanying drawings, so that those skilled in the art may easily carry out the example embodiment of the present disclosure. However, the present disclosure may be implemented in various different forms, and is not limited to the example embodiments described herein. With regard to the description of drawings, same or like reference numerals denote same or like components. Further, in the drawings and related description, description for well-known function and configuration may be omitted for clarity and conciseness.

FIG. 1 is a cross-sectional view of a display device according to an example embodiment of the present disclosure.

A display panel 110 of the display device 100 is a panel in which the image is implemented and may include a display element and a driving circuit unit, which can also be refered to as a driving circuit, for implementing the image.

For example, when the display device 100 is an organic light emitting display device, the display element may include an organic light emitting diode. Hereinafter, for the convenience of description, it is assumed that the display device 100 according to various example embodiments of the present disclosure is a display device including an organic light emitting diode, but the present disclosure is not limited thereto.

A circuit unit, which can also be refered to as a circuit, may include various thin film transistors, capacitors, wiring lines, and driving ICs for driving the organic light emitting diode. For example, the circuit unit may include various configurations such as a driving thin film transistor, a switching thin film transistor, a storage capacitor, a gate line, a data line, a gate driver IC, and a data driver IC, but is not limited thereto.

In the display device 100, the display panel 110 includes a substrate. The substrate may be an insulating plastic substrate which is one of polyimide, polyethersulfone, polyethylene terephthalate, and polycarbonate, but is not limited thereto and may also be formed of another material.

In the meantime, a support member such as a back plate may be further disposed below the substrate. The back plate supports the substrate so as not to be sagged and protects components disposed on the substrate from moisture, heat, and impact from the outside. The back plate may be a plastic material such as polymethylmethacrylate, polycarbonate, polyvinyl alcohol, acrylonitryl-butadiene-styrene, or polyethylene terephthalate, but is not limited thereto. When the back plate is disposed below the substrate, an adhesive layer may be disposed between the substrate and the back plate to bond the substrate and the back plate. The adhesive layer may use an optical clear adhesive, a pressure-sensitive adhesive, or an optical clear resin, but is not limited thereto.

An optical laminate 130 is disposed on the display panel 110. The adhesive layer 120 may be disposed between the display panel 110 and the optical laminate 130. The adhesive layer 120 may be an optical clear adhesive, an optical clear resin, or a pressure-sensitive adhesive, but is not limited thereto. The optical laminate 130 is disposed above the display panel 110 to reduce reflectance for the external light which is incident from the outside of the display device 100.

The optical laminate 130 may include a base material layer 131, a multi-functional layer 132, and a passivation layer 133. The base material layer 131, the multi-functional layer 132, and the passivation layer 133 may be sequentially laminated, but is not limited thereto and the optical laminate 130 may be configured to be bendable. For example, at least a part of the optical laminate 130 may be configured so as not to cause the crack according to the bendability test. In the meantime, the optical laminate 130 which is applied to various example embodiments of the present disclosure may not include the base material layer 131. Hereinafter, layers which form the optical laminate 130 will be described.

The base material layer 131 may facilitate handling during the manufacturing or transportation of the multi-functional layer 132. Further, the base material layer 131 is provided so that the damage of the multi-functional layer 132 may be suppressed during the stage of the optical laminate 130. As the base material layer 131, any transparent resin film used for optical purpose may be used without particular limitation. Examples of the resin material which configures the base material layer 131 may be one selected from a group consisting of chain olefin resins such as polyethylene and polypropylene; cyclic olefin type resins, such as a norbornene type polymer type; polyvinyl alcohol-based resin; polyethylene terephthalate-based resin; (meth) acrylic acid ester-based resin; cellulose ester-based resins such as triacetyl cellulose, diacetyl cellulose, and cellulose acetate propionate; polyethylene naphthalate-based resin; polycarbonate-based resin; sulfone-based resin; polyether-sulfone-based resin; polyether ketone-based resin; polyphe-nylene sulfide-based resin; polyphenylene oxide-based resin; polyimide resin; polyamide resin; polyamideimide resin; and a mixture thereof. Further, in the present disclosure, (meth)acryl refers to at least one selected from a group including a group consisting of acryl and methacryle. The same applies to (meth)acryloyl and (meth)acrylate.

A thickness of the base material layer 131 does not specifically limit the optical laminate 130, but in order to reduce the thickness and the weight of the optical laminate 130, is desirably thin within a range to ensure the strength and processability. For example, the thickness of the base material 131 is generally 50 μm or larger, beneficially, 10 μm or larger, and more beneficially, 20 μm or larger, and beneficially 100 μm or smaller, more beneficially 80 μm or smaller, and further beneficially, 60 μm or smaller.

Various example embodiments of the present disclosure are not limited thereto, and the base material layer 131 may have an anti-glare function, a reflection function, a surface antireflection function, a function as a retardation film, a transflective function combining a reflection function and a transmission function, a light diffusion function, and the like. Specifically, the surface processing layer (not illus-trated) and the base material layer 131 are integrally formed, the base material layer 131 may have the anti-glare function and the reflection function mentioned above.

The multi-functional layer 132 may contain a liquid crystal mixture including a liquid crystal compound and a dye. In a part of the multi-functional layer 132, the liquid crystal mixture including a liquid crystal compound and a dye is cured and in the remaining of the multi-functional layer 132, the liquid crystal compound may be cured. The part in which the liquid crystal mixture is cured serves as a linear polarizer and the remaining part in which the liquid crystal compound is cured serves as a phase retarder.

The multi-functional layer 132 of the present disclosure includes a linear polarizer and a phase retarder. The linear polarizer linearly polarizes light in one direction. For example, the linear polarizer linearly polarizes the light by transmitting light matching a polarization axis and absorbing light which does not match the polarization axis, by an aligned dichroic dye. The phase retarder changes the polar-ization state of the light with an optically anisotropic prop-erty. The phase retarder may change a linearly polarized state of light which transmits the linear polarizer to a circularly polarized state. Further, the phase retarder may change circularly polarized light into a linearly polarized state. For example, the phase retarder disposed below the linear polarizer is a $\lambda/4$ retarder. The $\lambda/4$ retarder is an optical layer which retards a phase of light by $\lambda/4$. For example, when a wavelength of light which transmits the linear polarizer to be provided to the $\lambda/4$ retarder is 550 nm, light which passes the $\lambda/4$ retarder may have a phase retardation value of 137.5 nm.

In the meantime, in various example embodiments of the present disclosure, the linear polarizer of the multi-func-tional layer 132 may have a polarization axis of ±45 degrees with respect to the polarization axis of the phase retarder. In order to implement the polarization axis difference of ±45 degrees, an alignment of the liquid crystal mixture which configures the linear polarizer and an alignment of the liquid crystal mixture which configures the phase retarder may be different. The difference in the alignment of the linear polarizer and the phase retarder will be described below.

Hereinafter, a liquid crystal compound and a dichroic dye which are applicable to the multi-functional layer 132 of the present disclosure will be described as an example. How-ever, the multi-functional layer 132 of various example embodiments of the present disclosure is not limited to the following examples.

The liquid crystal compound includes a liquid crystal functional group A and a photo alignment functional group B. The liquid crystal compound may be a monomer or a polymer which simultaneously includes the liquid crystal functional group A and the photo alignment functional group B.

The liquid crystal functional group (A) is a functional group derived from a polymerizable liquid crystal com-pound and imparts liquid crystal properties to the liquid crystal compound. When the liquid crystal compound is a polymer, the liquid crystal functional group A is a functional group formed from the polymerizable liquid crystal com-pound and refers to the remaining functional groups after copolymerization by the polymerizable functional group of the polymerizable liquid crystal compound.

The polymerizable liquid crystal compound may refer to a compound including a part representing the liquid crystal property and one or more polymerizable functional group. For example, the polymerizable liquid crystal compound may be a liquid crystal compound including a liquid crystal site such as a mesogen backbone and a polymerizable functional group such as (meth)acrylate group formed at a terminal, but is not limited thereto. That is, the polymeriz-able liquid crystal compound may be used without limitation as long as a liquid crystal material includes a polymerizable functional group at the terminal.

The photo alignment functional group B is a functional group derived from the polymerizable photo alignment compound and imparts the photo alignment property to the liquid crystal compound. When the liquid crystal compound is a polymer, the photo alignment functional group B is a functional group formed from the polymerizable liquid crystal compound and refers to the remaining functional groups after copolymerization by the polymerizable functional group of the polymerizable photo alignment compound.

The polymerizable photo alignment compound may refer to a compound including a part representing the photo alignment property and one or more polymerizable functional group. For example, the polymerizable photo alignment compound may be a photo alignment compound including a photo alignment site formed of a photo alignment material and a polymerizable functional group such as (meth)acrylate group formed at a terminal, but is not limited thereto. That is, the polymerizable photo alignment compound may be used without limitation as long as a photo alignment material includes a polymerizable functional group at the terminal.

For example, a photopolymerizable material may be a cinnamate-based material, a photoisomerization material may be an azo-based material, and a photodegradable material may be a cyclic polyimide-based material including cyclobutane dianhydride (CBDA). To be more specific, the polymerizable photo-alignment compound may be a (meth) acrylate-based polymer, a cycloolefin-based polymer, or a siloxane-based polymer. In order to align a liquid crystal functional group, a photoisomerization polymer having an azo site, a photodimerization polymer having a cinnamate site, or a chalcone site, and a photodecomposable polymer having a cyclobutane site, as a photo-sensitive site, may be used. As the photodimerization polymer, a (meth)acrylate-based polymer, a cycloolefin-based polymer, or a siloxane-based polymer is desirable and for a side chain of this polymer, a (meth)acrylate-based polymer or a cycloolefin-based polymer having a cinnamate structure or a chalcone structure as a photodimerization site may be used.

When UV is irradiated onto the liquid crystal compound, the photo alignment functional group B is aligned in a specific direction by the chemical reaction of the photo alignment functional group B to align the liquid crystal functional group A in the same molecule in one direction. For example, when the photo alignment functional group B of the liquid crystal compound is made of a photo-isomerization material, the photo alignment functional group is aligned while being changed to cis or trans by the photo-isomerization reaction to align the liquid crystal functional group A in one direction.

A dichroic dye refers to a dye having a property in which the absorbance in the direction of the major axis of the molecule is different from the absorbance in the direction of the minor axis of the molecule. The dichroic dye may be a pigment, a colorant, or a non-liquid crystalline dichroic dye. The dichroic dye includes a polymerization group in one example, but may not include a polymerization group in another example. The dichroic dye desirably has an absorption maximum wavelength λMAX within a range of 300 nm to 700 nm. Examples of the dichroic dye may include an acridine dye, an oxazine dye, a cyanine dye, a naphthalene dye, an azo dye, and an anthraquinone dye. Examples of the azo dye may include a monoazo dye, a bisazo dye, a trisazo dye, a tetrakisazo dye, and a stilbenazo dye. The dichroic dye may be used alone or in combination of two or more. Further, in order to achieve the absorption in the entire visible ray range, three or more dichroic dyes (for example, three or more azo dyes) may also be used in combination.

In the meantime, for the convenience of description, a direction used in the following specification will be defined in advance. The first direction is perpendicular to the second direction. Both the first direction and the second direction may be defined on the two-dimensional coordinate system. The above definition may be understood as substantially the same meaning throughout the specification.

Figure 2:
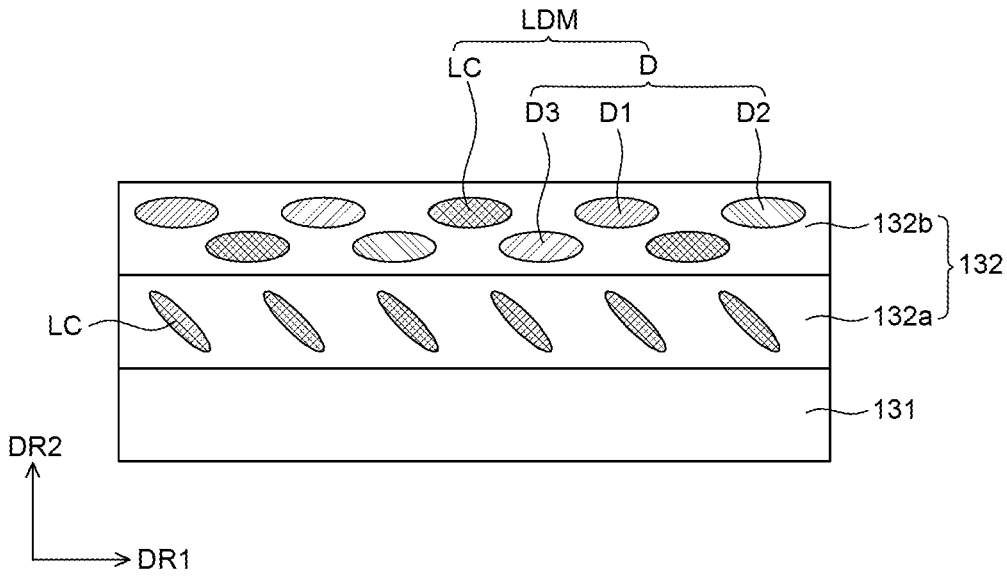
FIG. 2 is a cross-sectional view illustrating a first example embodiment of a multi-functional layer of the present disclosure.

FIG. 2 is a cross-sectional view illustrating a first example embodiment of a multi-functional layer 132 of the present disclosure.

Referring to FIG. 2, a multi-functional layer 132 is disposed on the base material layer 131. In the multi-functional layer 132, a phase retarder 132a and a linear polarizer 132b may be sequentially disposed in the second direction DR2. The phase retarder 132a and the linear polarizer 132b may be manufactured from substantially the same liquid crystal mixture LDM.

However, the example is not limited thereto. Therefore, due to the density difference or a weight difference between components which configure the liquid crystal mixture LDM, the liquid crystal compound LC among the components which configure the liquid crystal mixture LDM may be present over the phase retarder 132a and the linear polarizer 132b. However, the dichroic dye D may be present only in an area corresponding to the linear polarizer 132b. Accordingly, the multi-functional layer 132 with a structure in which the phase retarder 132a and the linear polarizer 132b are sequentially disposed along the second direction DR2 may be configured.

An adhesive layer or an adhesive is not disposed between the phase retarder 132a and the linear polarizer 132b which configure the multi-functional layer 132. The phase retarder 132a and the linear polarizer 132b are manufactured from one coating layer, but are not bonded to each other by an adhesive. Namely, the phase retarder 132a and the linear polarizer 132b are different regions of a single, continuous layer, i.e., the multi-functional layer 132.

In one example embodiment, the phase retarder 132a contains a liquid crystal mixture LDM in which dichroic dyes D and the liquid crystal compound LC are mixed. The phase retarder 132a may be manufactured by an alignment process of irradiating a linearly polarized UV light (LPUV light) onto the liquid crystal mixture LDM and a baking process of curing the liquid crystal mixture at a predetermined or selected temperature after the alignment process.

In one example embodiment, the linear polarizer 132b may contain a liquid crystal compound LC. The linear polarizer 132b may be manufactured using the liquid crystal mixture LDM, but the dichroic dye D is not included in an area corresponding to the linear polarizer 132b. In one example embodiment, the linear polarizer 132b may be manufactured by an alignment process of irradiating the LPUV light onto a liquid crystal mixture LDM, desirably, a liquid crystal mixture LDM which has little or no dichroic dye D and a baking process of curing the liquid crystal mixture at a predetermined or selected temperature after the alignment process.

According to the above-described process, the liquid crystal compound LC which configures the linear polarizer 132b and the liquid crystal compound LC which configures the phase retarder 132a are substantially the same. The linear polarizer 132b and the phase retarder 132a are manufactured from one coating layer containing a liquid crystal mixture LDM in different directions so that as described above, the liquid crystal compounds LC need to be substantially the same.

In one example embodiment, the liquid crystal compound LC and the dichroic dyes D which configure the linear polarizer 132b may be aligned substantially in the same direction. For example, the liquid crystal compound LC and the dichroic dyes D may be aligned to be parallel to a plane and may have an alignment direction of 0 degree or 90 degrees as vertically seen along the second direction DR2. In the meantime, the alignment direction of the liquid crystal compound LC and the dichroic dyes D which configure the linear polarizer 132b may be mentioned as a first alignment direction.

In one example embodiment, the liquid crystal compound LC which configures the phase retarder 132a may be aligned in a second alignment direction which is different from the first alignment direction of the linear polarizer 132b. For example, the liquid crystal compound LC which configures the phase retarder 132a may be aligned to be parallel to a plane along the first direction DR1. The liquid crystal compound LC may have a phase difference of 45 degrees from the alignment direction (for example, 0 degree or 90 degrees) of the linear polarizer 132b as vertically seen along the second direction DR2. The alignment direction of the liquid crystal compound LC which configures the phase retarder 132a may be mentioned as a second alignment direction.

In one example embodiment, the linear polarizer 132b may include at least one of a first dichroic dye D1, a second dichroic dye D2, and a third dichroic dye D3 as dichroic dyes D. The first dichroic dye D1 may represent cyan. The second dichroic dye D2 may represent magenta. The third dichroic dye D3 may represent yellow. As described above, the first dichroic dye D1, the second dichroic dye D2, and the third dichroic dye D3 may be configured to represent different colors from each other. According to the example embodiment of the present disclosure, a concentration ratio of the first dichroic dye D1, the second dichroic dye D2, or the third dichroic dye D3 which configures the linear polarizer 132b may vary depending on parts of the linear polarizer 132b, which will be described in detail below.

In the meantime, the linear polarizer 132b does not contain a polyvinylalcohol (hereinafter, PVA) based material. In other words, the linear polarizer 132b is different from a normal PVA film of the related art. The PVA film which is manufactured using a polyvinylalcohol based material is manufactured by a stretching process and may be coated on another layer (for example, a phase retardation layer) after being manufactured. The PVA film may cause a crack due to their inherent shrinkage in reliability environments. For example, when the PVA film and a phase retarder (for example, a quarter-wave plate (QWP)) are directly bonded, due to the absence of a base material which supports the shrinkage of the PVA film, the PVA film may cause the crack in a high temperature, high temperature and humidity, or thermal shock reliability test or verification. The crack causes light leakage and in a part in which the crack is generated, it is difficult to express black so that the reflection in the display panel may also be visible with the naked eye.

Figure 3:
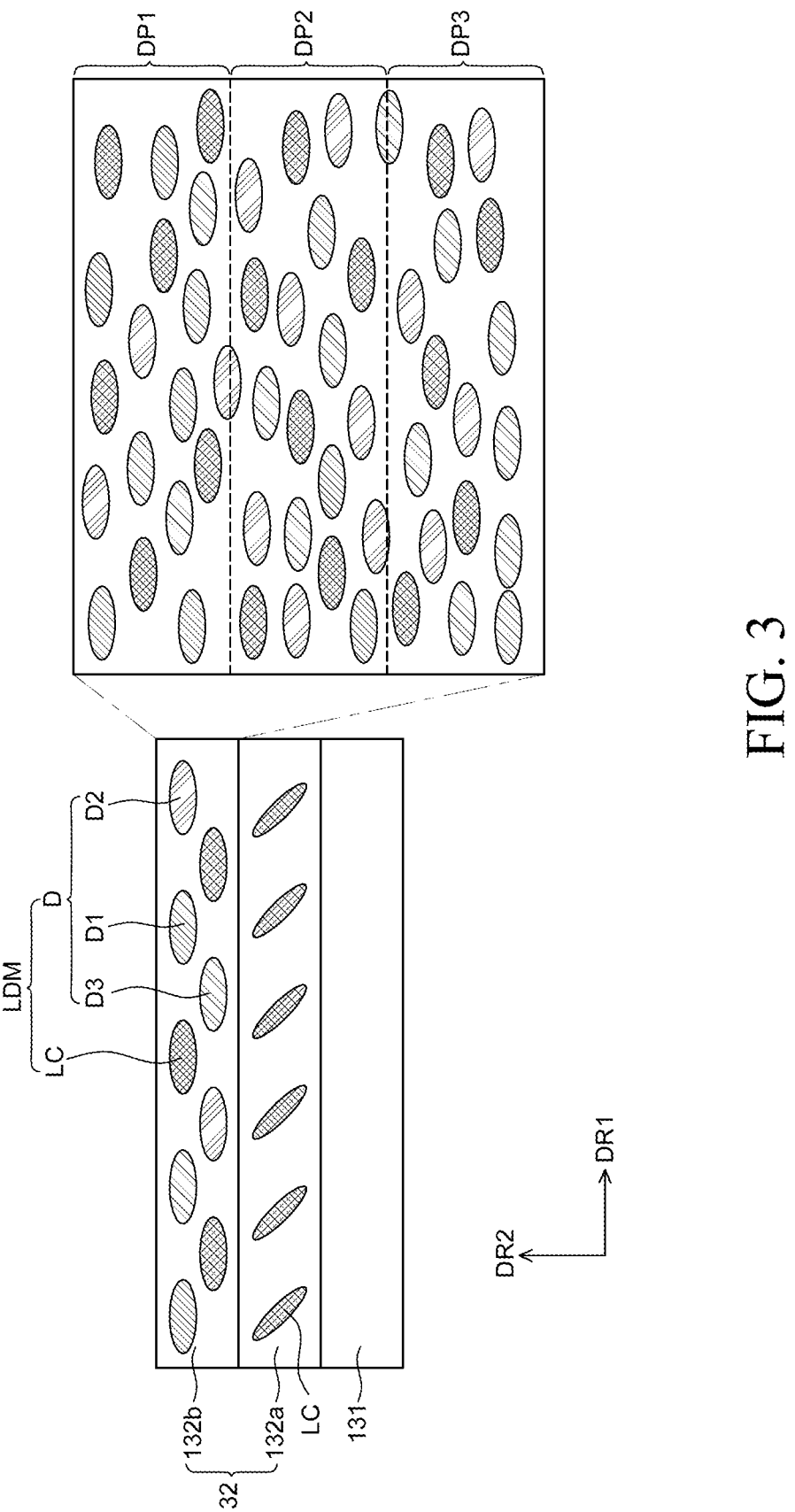
FIG. 3 is a cross-sectional view illustrating a second example embodiment of a multi-functional layer of the present disclosure.

FIG. 3 is a cross-sectional view illustrating a second example embodiment of a multi-functional layer 132 of the present disclosure.

For the convenience of description, a configuration of the multi-function layer 132 illustrated in FIG. 3 which is substantially the same as the multi-functional layer 132 described above with reference to FIG. 2 will not be described and the difference will be mainly described below. The multi-functional layer 132 illustrated in FIG. 3 may contain at least two types of dichroic dyes D and a liquid crystal compound LC. Two or more types of dichroic dyes D include a first dichroic dye D1, a second dichroic dye D2, and a third dichroic dye D3, but various example embodiments of the present disclosure are not limited thereto.

In one example embodiment, two or more types of dichroic dyes D contained in the linear polarizer 132a may form a concentration gradient along the second direction DR2. The concentration gradient may be arranged in different manners according to first to N-th parts (N is a natural number) of the linear polarizer 132b. The first to N-th parts of the linear polarizer 132b may be arranged along the second direction DR2 and the N-th part may correspond to a number of types of the dichroic dyes D contained in the linear polarizer 132b.

In one example embodiment, in the first to N-th parts, dichroic dyes D having the highest concentration ratio may be different, respectively. For example, when N is 3, in the first part DP1, the concentration ratio of the first dichroic dye D1 may be the highest, in the second part DP2, the concentration ratio of the second dichroic dye D2 may be the highest, and in the third part DP3, the concentration ratio of the third dichroic dye D3 may be the highest.

That is, in one example embodiment, the linear polarizer 132b may be include a plurality of parts based on the concentration ratios of the dichroic dyes D contained in the linear polarizer 132b. Specifically, boundaries between the plurality of parts which form the linear polarizer 132b may be locations where the concentration ratios of different types of dichroic dyes D contained in the linear polarizer 132b are substantially the same.

For example, the boundaries of the first to N-th parts may be arranged based on the concentration ratios of the first to N-th dichroic dyes. For example, a boundary between the first part DP1 and the second part DP2 may be a location where a concentration ratio of the first dichroic dye D1 and a concentration ratio of the second dichroic dye D2 contained in the linear polarizer 132b are substantially the same. For example, a boundary between the second part DP2 and the third part DP3 may be a location where a concentration ratio of the second dichroic dye D2 and a concentration ratio of the third dichroic dye D3 are substantially the same.

As described above, above or below the location in which the concentration ratio is substantially the same, a dichroic dye having the highest concentration ratio is different so that a part in which the concentration ratio is substantially the same may be a boundary of the parts of the linear polarizer 132b.

In one example embodiment, in the first part DP1, the concentration of the first dichroic dye D1 may be the highest. The concentration of the first dichroic dye D1 is reduced from the upper portion to the lower portion. Therefore, the multi-functional layer 132 may have a concentration gradient in which the concentration of the first dichroic dye D1 is increased from the lower portion to the upper portion.

In one example embodiment, in the second part DP2, the concentration of the second dichroic dye D2 may be the highest. The concentration of the second dichroic dye D2 is increased from the upper portion to the center and reduced from the center to the lower portion. Therefore, the multi-functional layer 132 may have a concentration gradient in which the concentration of the second dichroic dye D2 is increased from the lower portion to the center and is reduced from the center to the upper portion.

In one example embodiment, in the third part DP3, the concentration of the third dichroic dye D3 may be the highest. The concentration of the third dichroic dye D3 is increased from the upper portion to the lower portion. Therefore, the multi-functional layer 132 may have a concentration gradient in which the concentration of the third dichroic dye D3 is increased from the upper portion to the lower portion.

In one example embodiment, in the case of a dichroic dye having a smaller alignment property (for example, optical alignment property), among two or more types of dichroic dyes D, the multi-functional layer 132 may have a concentration gradient in which the concentration is increased toward the upper portion. In contrast, in the case of a dichroic dye having a larger alignment property (for example, optical alignment property), among two or more types of dichroic dyes D, the multi-functional layer 132 may have a concentration gradient in which the concentration is increased toward the lower portion. For example, when the alignment property of the first dichroic dye D1 is the smallest, as illustrated in FIG. 3, the multi-functional layer 132 may be configured such that the first dichroic dye D1 has the highest concentration in the first part DP1 and has the lowest concentration in the third part DP3.

In one example embodiment, the dichroic dyes D contained in the multi-functional layer 132 may be located according to a density difference or a weight difference. The dichroic dye having a high density is located on the bottom and the dichroic dye having a low density may be located on the top. For example, when the densities are high in the order of the first dichroic dye D1, the second dichroic dye D2, and the third dichroic dye D3, the third dichroic dye D3, the second dichroic dye D2, and the first dichroic dye D1 may be located on top in this order.

In one example embodiment, in the first part DP1, the dichroic dye having a low alignment property may be located beneficially so that the dichroic dye having a low alignment property may be configured to have a low density. In the second part DP2, a dichroic dye having an intermediate alignment property may be located beneficially so that the dichroic dye having the intermediate alignment property may be configured to have an intermediate density. In the third part DP3, a dichroic dye having a high alignment property may be located beneficially so that the dichroic dye having the high alignment property may be configured to have a high density.

In order to form the linear polarizer 132b having an excellent quality, the dichroic dye having a high alignment property has an excellent characteristic which is self-aligned even though the UV light is not irradiated so that an alignment degree beneficial for the design may be achieved. In contrast, the dichroic dye having a low alignment property may achieve an alignment degree beneficial for the design when it is supported by the UV light. In the multi-functional layer 132 which is applied to the example embodiment of the present disclosure, the dichroic dye having a high alignment property is located on the bottom and the dichroic dye having a low alignment property is located on the top depending on the density so that entirely uniform and excellent alignment degree may be achieved.

For example, the first dichroic dye D1 may be a cyan dye, the second dichroic dye D2 may be a magenta dye, and the third dichroic dye D3 may be a yellow dye. In one example embodiment, in order to implement the color of the multi-functional layer 132 as a predetermined or selected color, contents of the first to third dichroic dyes D1, D2, and D3 may also be partially adjusted. As contents of the first to third dichroic dyes D1, D2, and D3 are partially adjusted to adjust a reflection color of the multi-functional layer 132.

Hereinafter, the example embodiment will be described based on L, a*, and b* color spaces, but the present specification is not limited to the example embodiment.

According to various example embodiments of the present disclosure, in order to adjust the reflection color of the multi-functional layer 132, the dichroic dye D having the highest concentration in the first part DP1 may be differently configured. In Table 1, the first condition exemplifies a case that the first dichroic dye D1 (cyan) has the highest concentration in the first part DP1 and the second condition exemplifies a case that the second dichroic dye D2 (magenta) has the highest concentration in the first part DP1. Further, the third condition exemplifies a case that the third dichroic dye D3 (yellow) has the highest concentration in the first part DP1.

In the first to third conditions, the second part DP2 and the third part DP3, excluding the first part DP1, may contain different dichroic dyes from each other. For example, in the first condition, the second part DP2 and the third part DP2 may include a second dichroic dye D2 and a third dichroic dye D3. For example, in the second condition, the second part DP2 and the third part DP2 may include a first dichroic dye D1 and a third dichroic dye D3. For example, in the third condition, the second part DP2 and the third part DP2 may include a first dichroic dye D1 and a second dichroic dye D2.

TABLE 1

|  | First condition | Second condition | Third condition |
|---|---|---|---|
| Ts/PE (Single transmittance/degree of polarization) |  | 48.5%/85.5% |  |
| Transmission color Target (0, 0) | 0.1/−0.1 | 0.0/−0.1 | −0.1/0.0 |
| Reflection color Target (5, −0.5) | 6.3/−2.2 | 6.1/−1.5 | 4.6/−2.2 |

Figure 4A:
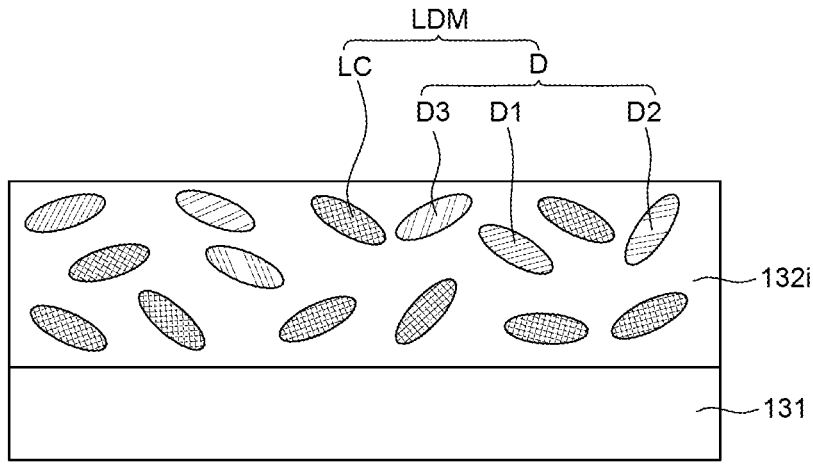
FIGS. 4A to 4C are views illustrating a process of manufacturing a multi-functional layer.
Figure 4B:
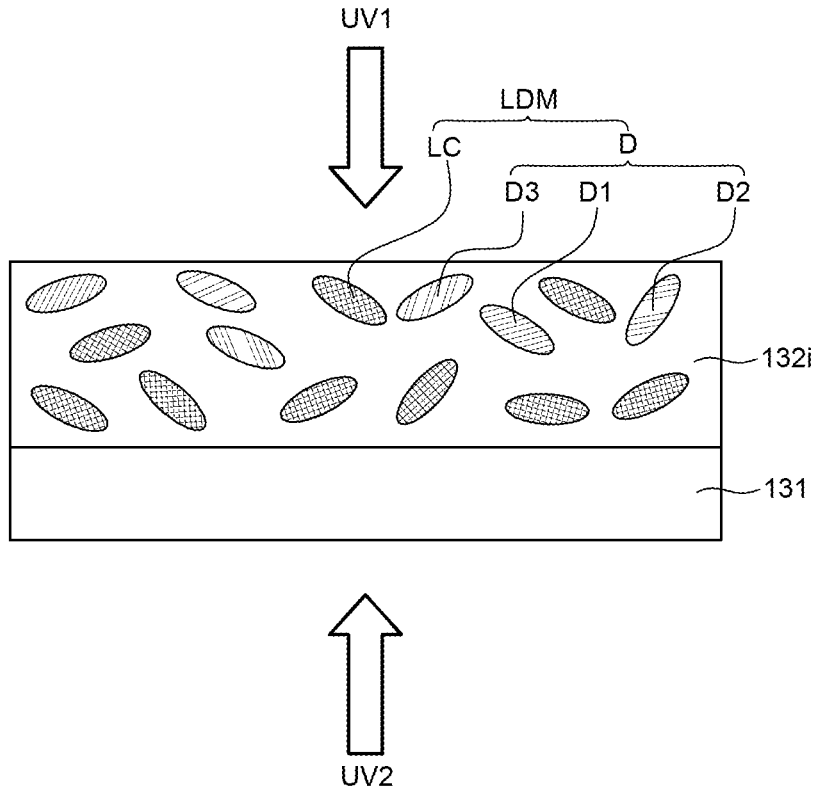
Figure 4C:
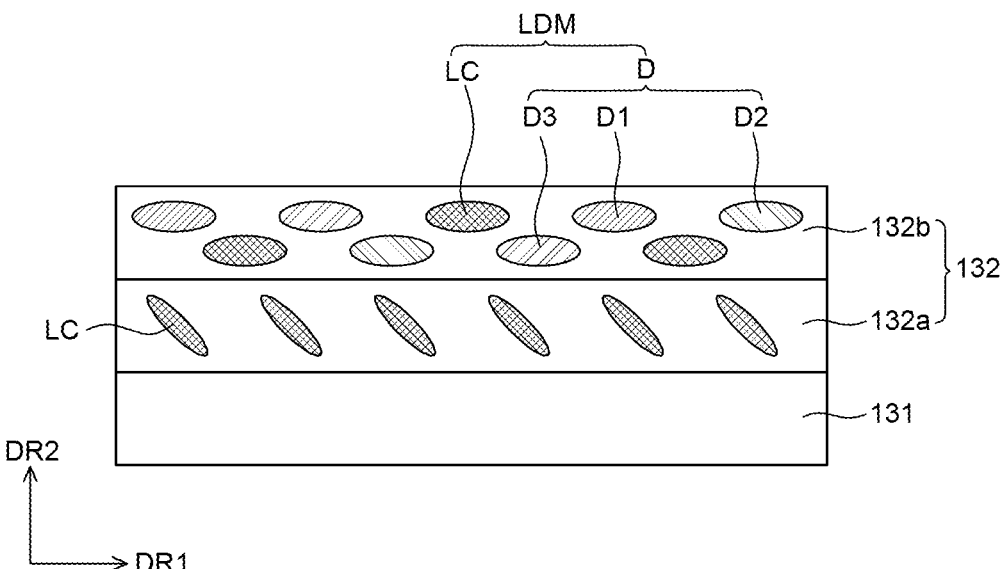

A color coordinate of Table 1 is a* and b* coordinates and the experiment was performed with a color coordinate (0, 0) as a target of a transmission color and a color coordinate (5, −0.5) as a target of a reflection color. From the result, it was confirmed that the second condition represented a reddish reflection color as compared with the first condition and the third condition represented a reddish reflection color as compared with the second condition. Further, in each condition, the transmission condition was confirmed to be the same or similar. FIGS. 4A to 4C are views illustrating a process of manufacturing a multi-functional layer 132.

Referring to FIG. 4A, an initial complex layer 132i may be disposed on a base material layer 131. The initial complex layer 132i may include a liquid crystal mixture LDM. The liquid crystal mixture LDM may contain a liquid crystal compound LC and two or more types of dichroic dyes D. The liquid crystal mixture LDM and the dichroic dyes D contained in the initial complex layer 132i are maintained so as not to be aligned in one direction.

In one example embodiment, the liquid crystal compound LC and the dichroic dyes D may be at least partially separated according to a density difference or a weight difference. For example, the liquid crystal compound LC may have a density higher than that of the dichroic dyes D and in this case, the liquid crystal compound LC may be located below the dichroic dyes D even though there is no other process. As another example, the liquid crystal compound LC may have a density lower than that of the dichroic dyes D and in this case, the liquid crystal compound LC is located above the dichroic dyes D even though there is no other process. FIGS. 4A to 4C illustrate that the liquid crystal compound LC has a higher density than the dichroic dyes D, but the multi-functional layer 132 which is applied to various example embodiments of the present disclosure is not limited to the description.

In one example embodiment, the initial complex layer 132i may be disposed by wet coating, such as spin coating or printing such as screen printing or inkjet printing.

Referring to FIG. 4B, linearly polarized UV (LPUV) light may be irradiated from above and below the initial complex layer 132i. First LPUV light UV1 is UV light linearly polarized at 0 degree or 90 degrees and second LPUV light UV2 is UV light linearly polarized at 45 degrees or 135 degrees. The first LPUV light UV1 is linearly polarized to have a phase difference of +45 degrees from the second LPUV light UV2.

In one example embodiment, the first LPUV light UV1 is light for forming a linear polarizer and is irradiated onto a first surface having a high concentration of dichroic colors D. The first surface is one of a top surface or a bottom surface of the initial complex layer 132i. When a density of the dichroic dye is higher than that of the liquid crystal compound LC, the first surface is the bottom surface and when a density of the dichroic dye is lower than that of the liquid crystal compound LC, the first surface may be the top surface.

The second LPUV light UV2 is light for forming the phase retarder 132a and is irradiated onto the second surface having a high concentration of the liquid crystal compound LC. The second surface is one of a top surface or a bottom surface of the initial complex layer 132i. When a density of the liquid crystal compound LC is higher than that of the dichroic dye, the second surface is the bottom surface and when a density of the liquid crystal compound LC is lower than that of the dichroic dye, the second surface may be the top surface. The first surface and the second surface are opposite to each other so that when the first surface is a top surface, the second surface is a bottom surface and when the first surface is a bottom surface, the second surface is a top surface.

Referring to FIG. 4C, the liquid crystal mixture LDM contained in each surface of the initial complex layer 132i on which the first LPUV light UV1 and the second LPUV light UV2 are irradiated is aligned by the first LPUV light UV1 and the second LPUV light UV2. The first LPUV light UV1 is irradiated on a surface in which the dichroic dye has a high concentration and the dichroic dyes D and the liquid crystal compound LC may be aligned along the first alignment direction. As the liquid crystal compound LC is aligned by the first LPUV light UV1, the dichroic dyes D may be aligned substantially in the same direction as the liquid crystal compound LC.

The second LPUV light UV2 is irradiated on a surface in which the liquid crystal compound LC has a high concentration and the liquid crystal compounds LC may be aligned in the second alignment direction. Therefore, the liquid crystal compound LC which is aligned by the second LPUV light UV2 and the liquid crystal compound LC which is aligned by the first LPUV light UV1 may have an angle difference of 45 degrees with respect to each other.

As described above, the liquid crystal mixture LDM which is aligned by the first LPUV light UV1 and the second LPUV light UV2 may be cured by the post-baking process. After the post-baking process, a part of the initial complex layer 132i which is aligned by the first LPUV light UV1 and has a high concentration of the dichroic dye becomes a linear polarizer 132b. After the post-baking process, a remaining part of the initial complex layer 132i which is aligned by the second LPUV light UV2 and has a high concentration of the liquid crystal compound LC becomes a phase retarder 132a.

As a result, according to the manufacturing method of the present disclosure, the linear polarizer 132b and the phase retarder 132a may be formed on one single layer without performing a separate lamination process. Accordingly, an adhesive for the lamination process may be omitted in the layered structure so that the complexity of the process may be significantly improved. Further, the adhesive is omitted so that the overall thickness of the display device may be further reduced.

FIGS. 5A to 5D are views illustrating a process of manufacturing a multi-functional layer 132.

Figure 5A:
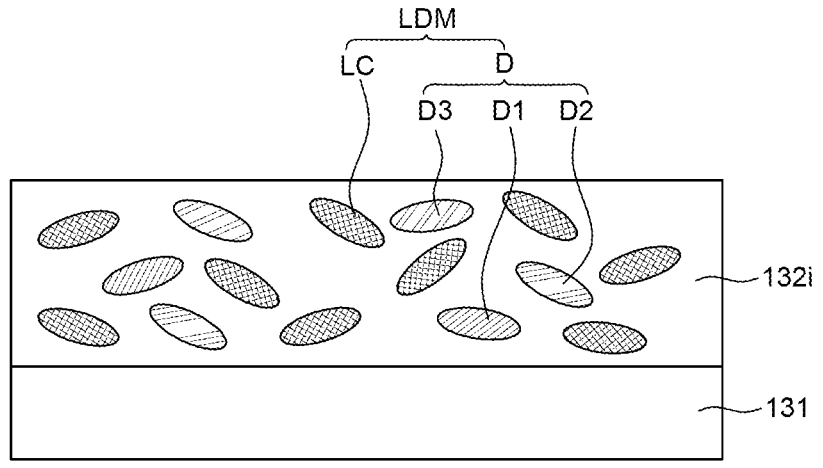
FIGS. 5A to 5D are views illustrating a process of manufacturing a multi-functional layer.

Referring to FIG. 5A, an initial complex layer 132i may be disposed on a base material layer 131. The initial complex layer 132i may include a liquid crystal mixture LDM. The liquid crystal mixture LDM may contain a liquid crystal compound LC and two or more types of dichroic dyes D. The liquid crystal mixture LDM and the dichroic dyes D contained in the initial complex layer 132i are maintained so as not to be aligned in one direction.

In one example embodiment, the initial complex layer 132i may be disposed by wet coating, such as spin coating or printing such as screen printing or inkjet printing.

In one example embodiment, the liquid crystal compound LC and the dichroic dyes D may have substantially the same or similar density. In this case, the dichroic dyes D may be significantly distributed over the entire area of the initial complex layer 132i. Accordingly, a process for separating the dichroic dyes D and the liquid crystal compound LC up and down needs to be additionally introduced. The manufacturing method according to the example embodiment of the present disclosure may further include a pre-baking process for separating the dichroic dyes D and the liquid crystal compound LC.

Figure 5B:
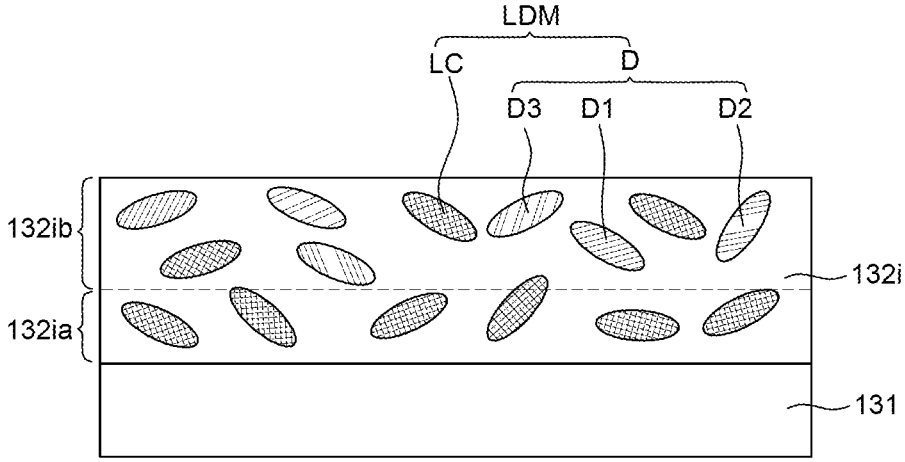

Referring to FIG. 5B, the manufacturing method may further include a pre-baking process for separating the liquid crystal compound LC and the dichroic dyes D in the initial complex layer 132i. Specifically, the manufacturing method may further include a phase separation process and the pre-baking process. The initial complex layer 132i on the base material layer 131 may contain the liquid crystal mixture LDM as described above with reference to FIG. 5A.

The phase separation process is a process of gradually lowering a temperature of the liquid crystal mixture LDM which is mixed in a liquid phase after heating the initial complex layer 132i disposed on the base material layer 131 to a high temperature. By doing this, each material (for example, the liquid crystal compound LC and the dichroic dyes D) contained in the liquid crystal mixture LDM are separated into each phases. The manufacturing method according to the example embodiment of the present disclosure may implement the phase separation process using spinodal decomposition.

The pre-baking process is a process of maintaining a predetermined or selected temperature to maintain phases of materials (for example, the liquid crystal compound LC and the dichroic dyes D) of the liquid crystal mixture LDM which is separated by the phase separation process. The pre-baking process is performed after the phase separation process, but is not limited thereto and the pre-baking process may also be continuously or integrally performed with the phase separation process.

The initial complex layer 132i may include a first intermediate state unit or region 132ia and a second intermediate state unit or region 132ib by the phase separation process and the pre-baking process. The first intermediate state unit 132ia may contain the liquid crystal compound LC and the dichroic dyes D. The liquid crystal compound LC and the dichroic dyes D contained in the first intermediate state unit 132*ia* are present in a randomly aligned state. The second intermediate state unit 132*ib* contains the liquid crystal compound LC, but has little or no dichroic dyes D. The liquid crystal compound LC contained in the second intermediate state unit 132*ib* is present in a randomly aligned state. The first intermediate state unit 132*ia* may be disposed above the second intermediate state unit 132*ib*, but various example embodiments of the present disclosure are not limited thereto.

Figure 5C:
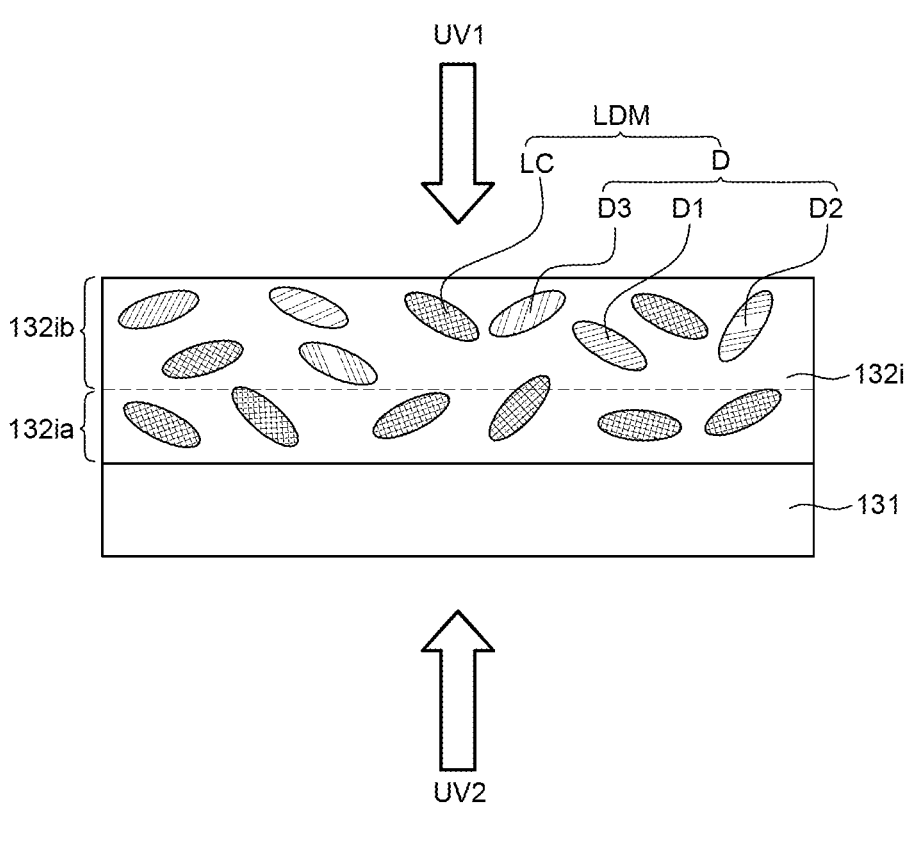

Referring to FIG. 5C, LPUV light may be irradiated onto each of the first intermediate state unit 132*ia* and the second intermediate state unit 132*ib*. The first LPUV light UV1 is irradiated onto the first intermediate state unit 132*ia* and the second LPUV light UV2 may be irradiated onto the second intermediate state unit 132*ib*. First LPUV light UV1 is UV light linearly polarized at 0 degree or 90 degrees and second LPUV light UV2 is UV light linearly polarized at 45 degrees or 135 degrees. The first LPUV light UV1 is linearly polarized to have a phase difference of ±45 degrees from the second LPUV light UV2.

As described above with reference to FIG. 4C, the first LPUV light UV1 is light for forming a linear polarizer and is irradiated onto a first surface having a high concentration of dichroic colors D. For example, the first LPUV light UV1 may be irradiated onto one surface of the first intermediate state unit 132*ia*.

The second LPUV light UV2 is light for forming the phase retarder 132*a* and is irradiated onto the second surface having a high concentration of the liquid crystal compound LC. For example, the second LPUV light UV2 may be irradiated onto one surface of the second intermediate state unit 132*ib*.

Figure 5D:
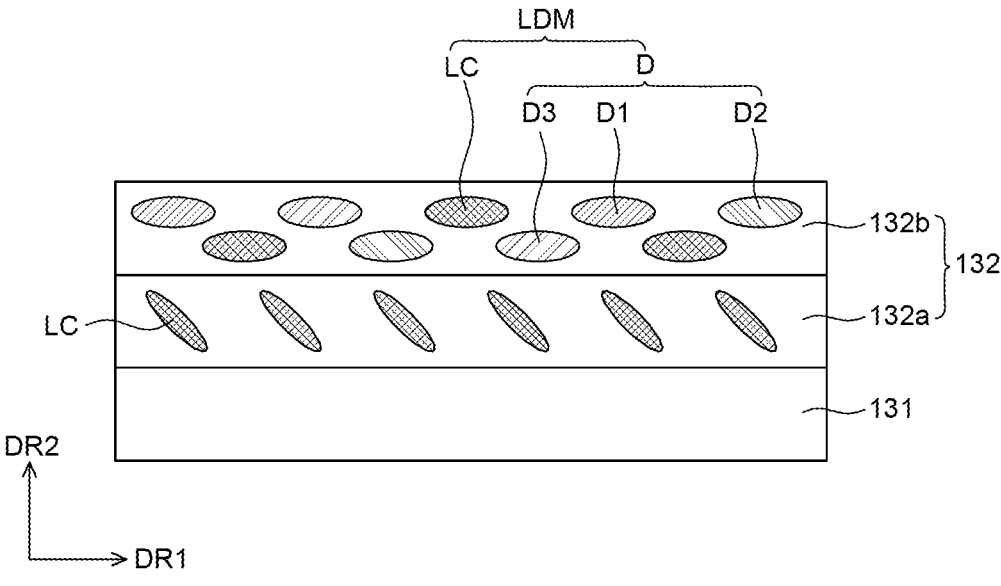

Referring to FIG. 5D, the liquid crystal mixtures LDM contained in each of the first intermediate state unit 132*ia* and the second intermediate state unit 132*ib* on which the first LPUV light UV1 and the second LPUV light UV2 are irradiated are aligned by the first LPUV light UV1 and the second LPUV light UV2.

The first LPUV light UV1 is irradiated onto the first intermediate state unit 132*ia* and the dichroic dyes D and the liquid crystal compound LC may be aligned along the first alignment direction. As the liquid crystal compound LC is aligned by the first LPUV light UV1, the dichroic dyes D may be aligned substantially in the same direction as the liquid crystal compound LC.

The second LPUV light UV2 is irradiated onto the second intermediate state unit 132*ib* and the liquid crystal compounds LC may be aligned along the second alignment direction. Therefore, the liquid crystal compounds LC which are aligned by the second LPUV light UV2 and the liquid crystal compound LC which are aligned by the first LPUV light UV1 may have an angle difference of at least 45 degrees.

As described above, the liquid crystal mixture LDM which is aligned by the first LPUV light UV1 and the second LPUV light UV2 may be cured by the post-baking process.

After the post-baking process, a part of the initial complex layer 132*i* which is aligned by the first LPUV light UV1 and has a high concentration of the dichroic dye D becomes a linear polarizer 132*b*. In other words, the first intermediate state unit 132*ia* becomes a linear polarizer 132*b* by the post-baking process.

After the post-baking process, a remaining part of the initial complex layer 132*i* which is aligned by the second LPUV light UV2 and has a high concentration of the liquid crystal compound LC becomes a phase retarder 132*a*. In other words, the second intermediate state unit 132*ib* becomes a phase retarder 132*a* by the post-baking process.

As a result, according to the manufacturing method of the present disclosure, the linear polarizer 132*b* and the phase retarder 132*a* may be formed on one single layer without performing a separate lamination process. Accordingly, an adhesive for the lamination process may be omitted in the layered structure so that the complexity of the process may be significantly improved. Further, the adhesive is omitted so that the overall thickness of the display device may further be reduced.

Further, even though the liquid crystal compound LC and the dichroic dye are not separated by layers according to the density, the intermediate process such as spinodal decomposition is introduced to separate the liquid crystal compound LC and the dichroic dyes D up and down. Thereafter, two types of LPUV light are irradiated to configure one initial complex layer 132*i* as a multi-functional layer having both the functions of linear polarization and phase retardation.

Further, according to the manufacturing method according to various example embodiments of the present disclosure, the linear polarizer and the phase retarder are not provided as separate layers (that is, a linear polarization layer and a phase retardation layer). Further, a lamination process of bonding the linear polarization layer and the phase retardation layer is not performed. Further, the linear polarizer is coated on the phase retardation layer to be bonded to each other. However, based on experimental data, the inventors have confirmed that separation between the linear polarization layer and the phase retardation layer was caused. According to various example embodiments of the present disclosure, the linear polarizer and the phase retarder are implemented as one single layer so that the lamination process is omitted and thus the peeling phenomenon is not caused.

Figure 6:
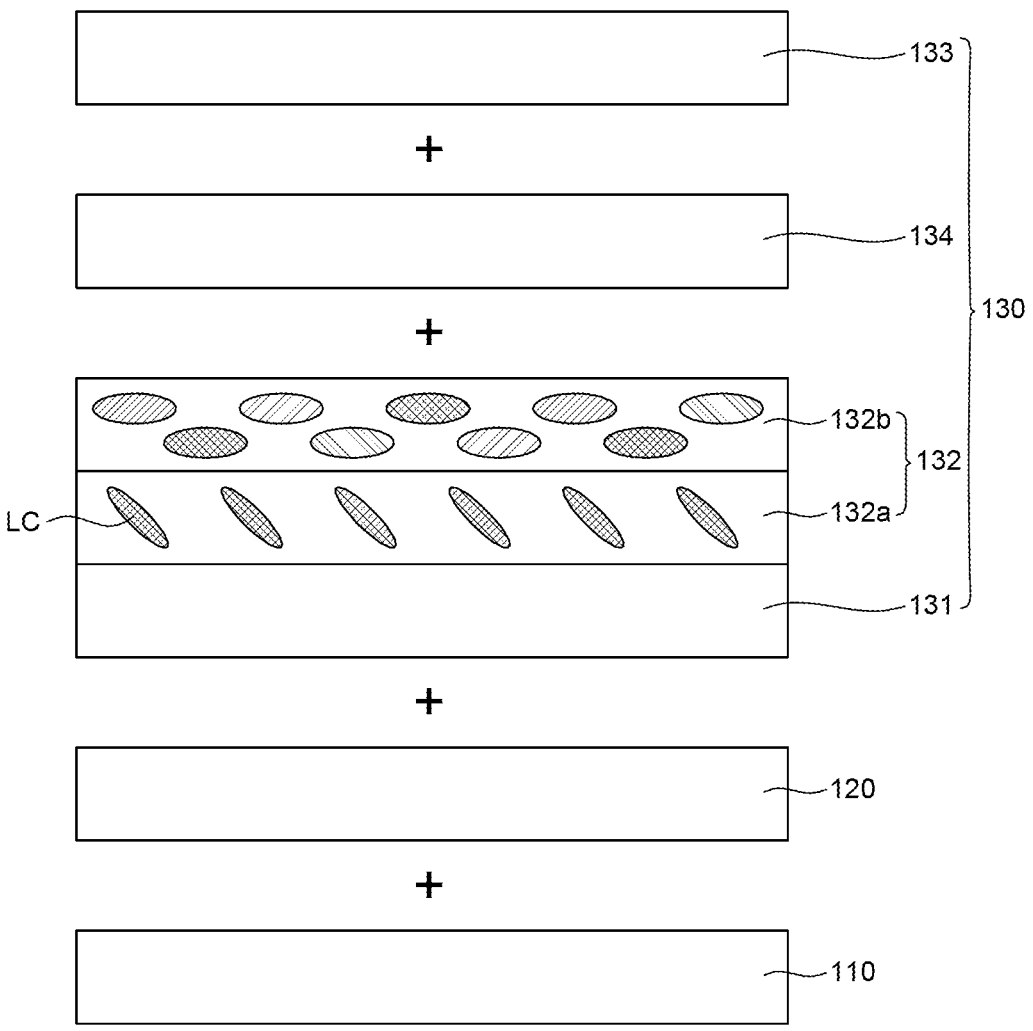
FIGS. 6, 7, and 8 are views illustrating a lamination relationship of layered structures of the display device.
Figure 7:
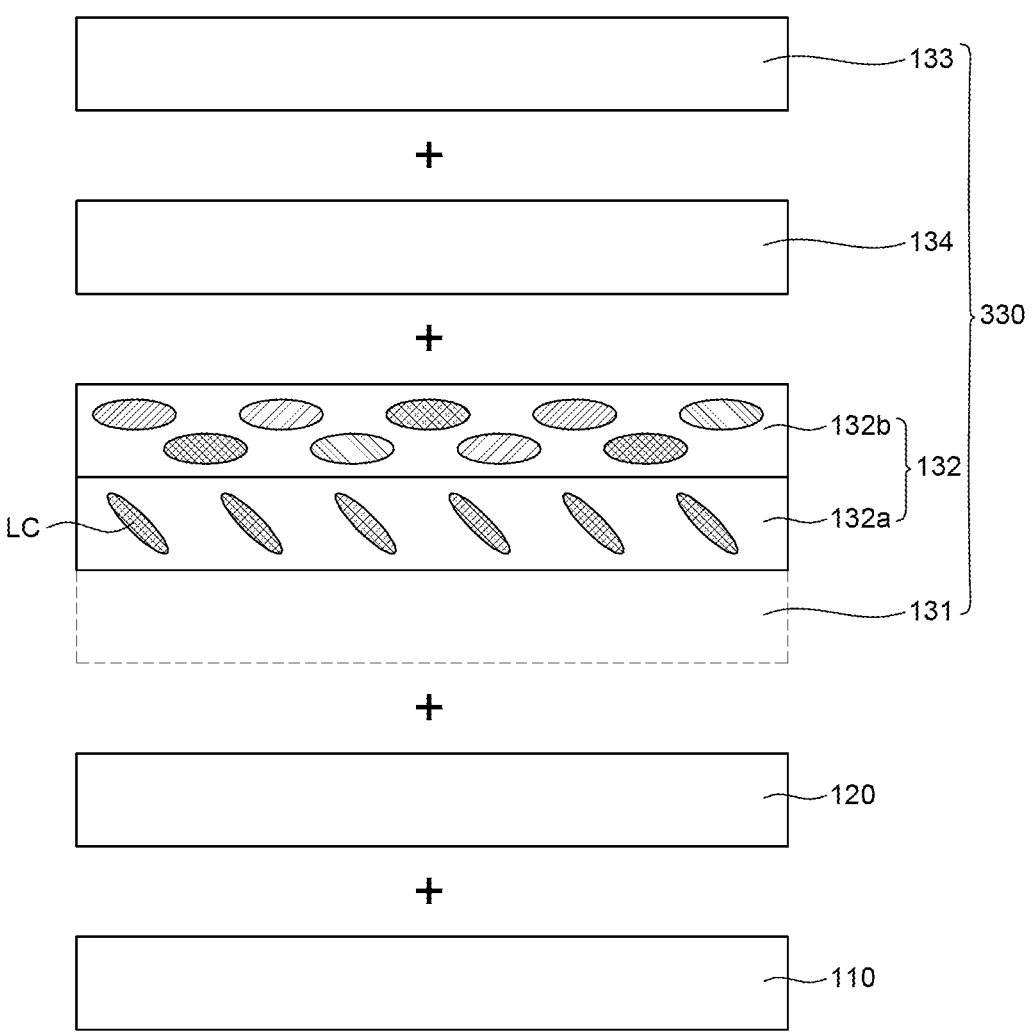
Figure 8:
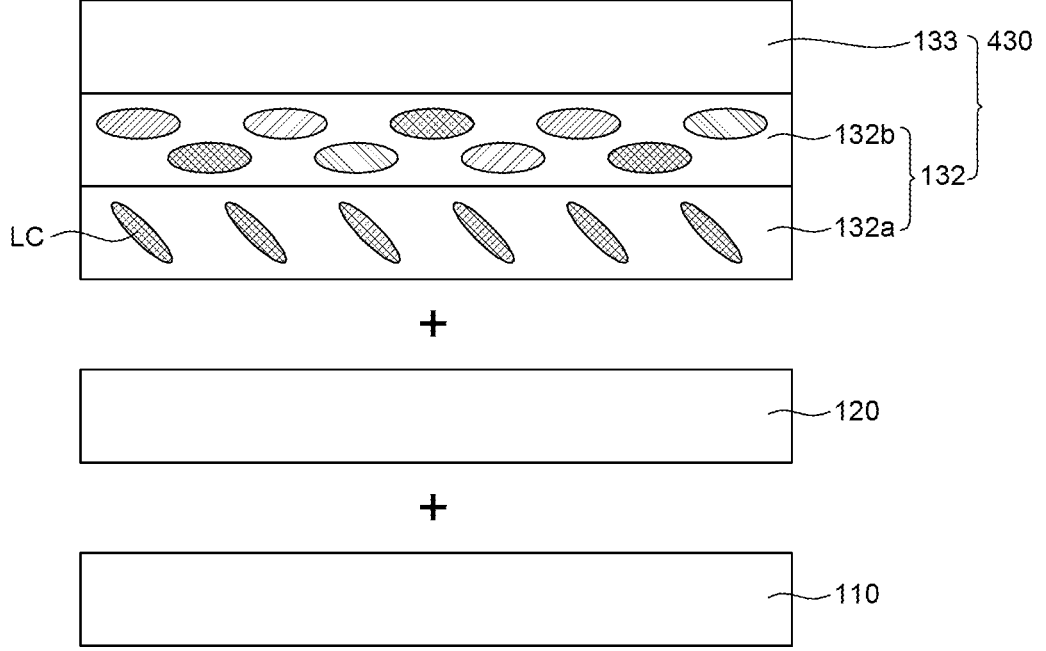

FIGS. 6, 7, and 8 are views illustrating a lamination relationship of layered structures of the display device.

Referring to FIGS. 6 to 8, the display device (the display 100 of FIG. 1) may include various layer structures. However, the example embodiment is not limited thereto and the layered structure which configures the display device may include a display panel 110, a first adhesive 120, and an optical laminate 130.

Referring to FIGS. 6 and 7, the optical laminate 130 is disposed on the display panel 110. The optical laminate 130 may be bonded to the display panel 110 by the first adhesive layer 120. The first adhesive layer 120 is substantially the same as the adhesive layer described above with reference to FIG. 1.

Referring to FIG. 6, the optical laminate 130 may include a base material layer 131, a multi-functional layer 132, a second adhesive layer 134, and a passivation layer 133. The multi-functional layer 132 is disposed on the base material layer 131 and is coated on the base material layer 131 or printed to be coupled to the base material layer. The passivation layer 133 is disposed on the multi-functional layer 132 and may be bonded with the multi-functional layer 132 by the second adhesive layer 134. The second adhesive layer 134 may be substantially the same as the first adhesive layer 120, but is not limited thereto so that the second adhesive layer 134 may also be configured with a different material from the first adhesive layer 120.

Referring to FIG. 7, the optical laminate 330 may include a multi-functional layer 132, a second adhesive layer 134, and a passivation layer 133, and a base material layer 131 may be excluded. That is, the optical laminate 330 may be manufactured as a transfer type. In the manufacturing method described above with reference to FIGS. 4A to 5D, the base material layer 131 may be a base material for transferring. The base material for transferring may be separated from the other component disposed thereabove. The base material for transferring may be easily separated from the multi-functional layer 132 disposed thereabove and as a result, an optical laminate 330 which does not include the base material layer 131 may be manufactured. In this case, the multi-functional layer 132 may be bonded to the display panel 110 by the first adhesive 120.

The optical laminate 330 which does not include the base material layer 131 may have a smaller thickness as much as a thickness of the base material 131 as compared with the optical laminate 330 described above with reference to FIG. 6. As a result, the display device including the optical laminate 330 illustrated in FIG. 7 may have a thickness smaller than the display device which includes the optical laminate 330 as illustrated in FIG. 6.

Referring to FIG. 8, the optical laminate 430 may include a multi-functional layer 132, and a passivation layer 133, and a base material layer 131 and a second adhesive layer 134 may be excluded. The multi-functional layer 132 of FIG. 8 may be formed on the passivation layer 133. Specifically, in the manufacturing method described above with reference to FIGS. 4A to 5D, the passivation layer 131 may be used instead of the base material layer 131. The initial complex layer 132i may be applied on the passivation layer 133 and first LPUV light UV1 and second LPUV light UV2 are irradiated on the initial complex layer 132i. After the liquid crystal mixture LDM of the initial complex layer 132i has an alignment property by the first LPUV light UV1 and the second LPUV light UV2, when the initial complex layer 132i is cured by the post-baking process, an optical laminate 430 illustrated in FIG. 8 may be obtained.

Here, the linear polarizer 132b is formed to be adjacent to the passivation layer 133 and the phase retarder 132a may be formed to be spaced apart from the passivation layer 133. To this end, during the manufacturing process, the liquid crystal mixture LDM containing dichroic dyes D may be disposed below the liquid crystal compound LC. For example, a liquid crystal mixture LDM including dichroic dyes D which have a density higher than the liquid crystal compound LC so that the liquid crystal mixture LDM may be disposed therebelow. As another example, the liquid crystal mixture LDM containing the dichroic dyes D may also be located therebelow by the phase separation process.

In the meantime, the optical laminate 430 may be bonded to the display panel 110 by the first adhesive 120. Specifically, the multi-functional layer 132 of the optical laminate 430 may be bonded to the display panel 110 by the first adhesive 120.

As described above, the optical laminate 430 is formed on the passivation layer 133 so that the passivation layer 133 and the base material layer 131 of the optical laminate 430 illustrated in FIG. 6 are integrated. Further, the multi-functional layer 132 is also integrally formed on the integrated passivation layer 133 so that the bonding process therefore may be omitted. As the bonding process is omitted, there is no need to introduce the adhesive and ultra-thin display device may be implemented.

Figure 9:
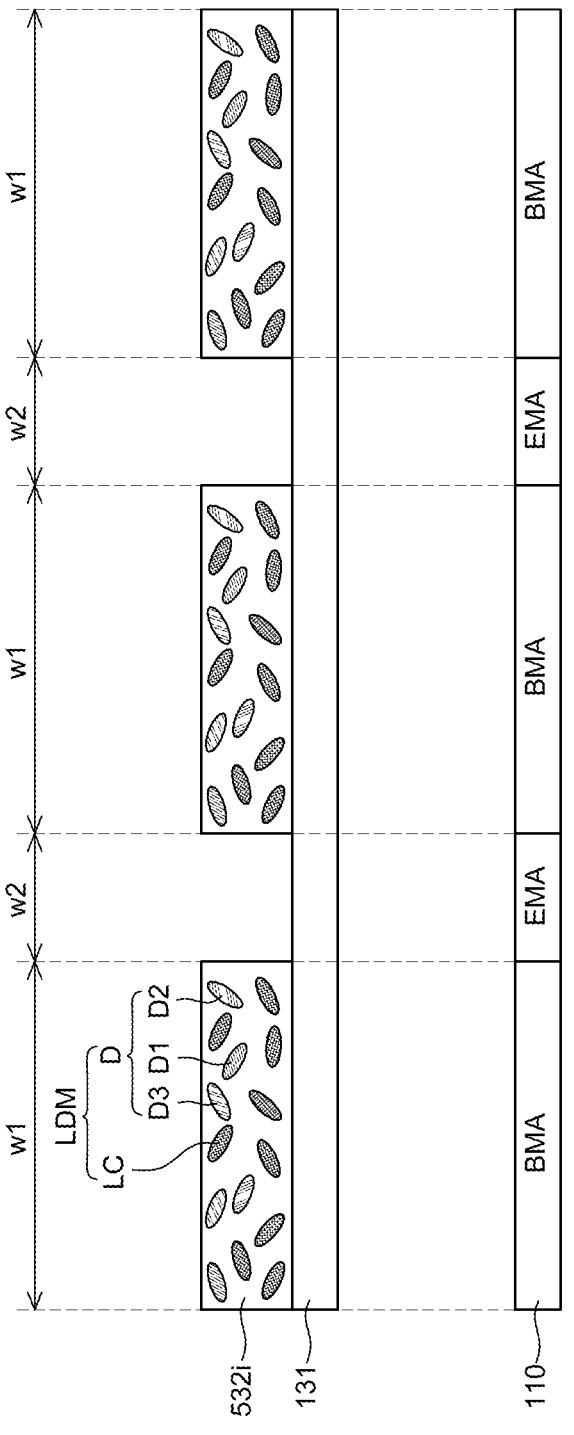
FIG. 9 is a view illustrating a method of applying a coating layer of FIGS. 4A and 5B by inkjet printing.

FIG. 9 is a view illustrating a method of applying an initial complex layer 132i of FIGS. 4A and 5B by inkjet printing.

Referring to FIGS. 4A and 5A, an initial complex layer 532i may be disposed on a base material layer 131. The initial complex layer 532i may contain the liquid crystal mixture LDM and the liquid crystal mixture LDM may include a liquid crystal compound LC and dichroic dyes D. In the following description, the term "printing" is explained on the premise of "inkjet printing," but the printing method in this specification is not limited to inkjet printing.

Referring to FIG. 9, the initial complex layer 532i may be applied by the inkjet printing. The initial complex layer 532i may be printed on the entire area of the base material layer 131, but according to the example embodiment of the present disclosure, may also be printed only in a partial area of the base material layer 131. For example, the initial complex layer 532i may be printed with a first length w1 and there may be an interval with a second length w2 between the initial complex layers 532i printed with the first length w1. For example, the initial complex layers 532i may be printed with an arbitrary length and there may be an interval of second length w2 between the initial complex layers 532i.

In the meantime, in the organic light emitting display device, a light emitting diode may include a cathode, an anode, and a light emitting material provided between the cathode and the anode. The light emitting diode may apply a voltage difference to the light emitting material using the cathode and the anode, and as a result, generate light through the light emitting material.

An emission area EMA of the present disclosure may be defined as one area in which the light emitting material is provided, between the cathode and the anode. In the meantime, in the remaining area excluding the emission area EMA, the light emitting material is not provided or metal or non-metal material which blocks a light path of the light emitting diode is located so that light is not transmitted. The area in which the light is not transmitted may be defined as a non-emission area BMA.

In one example embodiment, the first length w1 may correspond to the non-emission area BMA of the light emitting diode provided in the display panel 110 and the second length w2 may correspond to the emission area EMA of the light emitting diode provided in the display panel 110. For example, the second length w2 may be equal to or longer than the length of the emission area EMA with respect to the same direction. As another example, the second length w2 may be substantially equal to the length of the emission area EMA with respect to the same direction. As described above, a size of the emission area EMA and a length of an area in which the initial complex layer 531i is printed are aligned to improve the luminous efficiency by the multi-functional layer 132.

The example embodiments of the present disclosure can also be described as follows:

According to an aspect of the present disclosure, there is provided an organic light emitting display device. The organic light emitting display device comprises a display panel; and an optical laminate disposed on the display panel and including a multi-functional layer. The multi-functional layer contains a liquid crystal mixture including a liquid crystal compound and two or more types of dichroic dyes. Below the multi-functional layer, the liquid crystal compound is contained, but the two or more types of dichroic dyes are not included. And above the multi-functional layer, the two or more types of dichroic layers are contained.

The liquid crystal mixture may be cured as a linear polarizer above the multi-functional layer and may be cured as a phase retarder below the multi-functional layer.

A polarization axis of the linear polarizer may have a difference of ±45 degrees with respect to the polarization axis of the phase retarder.

The phase retarder may be a λ/4 retarder.

The linear polarizer may include the liquid crystal compound and the two or more types of dichroic dyes.

The liquid crystal compound and the two or more types of dichroic dyes contained in the linear polarizer may be aligned in the horizontal direction and the liquid crystal compound contained in the phase retarder may be aligned to form a predetermined or selected acute angle with the horizontal direction.

The two or more types of dyes which configure the linear polarizer may be configured with a higher density than the liquid crystal compound.

An adhesive may be not disposed between the linear polarizer and the phase retarder.

The two or more types of dyes may include a high alignment dichroic dye and a low alignment dichroic dye, and the high alignment dichroic dye may have a concentration gradient in which the high concentration is achieved below the linear polarizer and the low alignment dichroic dye may have a concentration gradient in which the high concentration is achieved above the linear polarizer.

The high alignment dichroic dye may have a higher density than the lower alignment dichroic dye.

The linear polarizer may include a first part in which the high alignment dichroic dye is contained with the highest concentration and a second part in which the low alignment dichroic dye is contained with the highest concentration and a boundary of the first part and the second part may be a location in which the concentrations of the high alignment dichroic dye and the low alignment dichroic dye are equal.

The liquid crystal compound and the dichroic dye contained in the linear polarizer may be aligned by first LPUV light.

The liquid crystal compound included in the phase retarder may be aligned by second LPUV light.

The first LPUV light may be UV light which is linearly polarized at 0 degree or 90 degrees and the second LPUV light may be UV light which is linearly polarized at 45 degrees or 135 degrees.

The multi-functional layer may be formed by irradiating first LPUV light on one surface and irradiating second LPUV light on the other surface and thermally curing by a baking process.

On one surface on which the first LPUV light is irradiated, the liquid crystal compound and the two or more types of dichroic dyes may be presented and the liquid crystal compound and the two or more types of dichroic dyes may be thermally cured to form the linear polarizer.

The liquid crystal compound may be present on the other surface on which the second LPUV light is irradiated and the liquid crystal compound may be thermally cured to form a phase retarder.

The linear polarizer and the phase retarder may be cured together while preforming the baking process.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting display device, comprising:
a display panel;
an optical laminate disposed on the display panel; and
a multi-functional layer within the optical laminate,
wherein:
the multi-functional layer contains a liquid crystal mixture including a liquid crystal compound and two or more types of dichroic dyes;
in a lower region of the multi-functional layer, the liquid crystal compound is present but the two or more types of dichroic dyes are not present;
in an upper region of the multi-functional layer, the two or more types of dichroic dyes are present;
the liquid crystal mixture is cured as a linear polarizer in the upper region of the multi-functional layer and is cured as a phase retarder in the lower region of the multi-functional layer;
the linear polarizer located on the upper region of the multi-functional layer and a phase retarder located on the lower region of the multi-functional layer are arranged continuously by phase separation of the liquid crystal mixture; and
an adhesive is not disposed between the linear polarizer and the phase retarder.

2. The organic light emitting display device according to claim 1, wherein a polarization axis of the linear polarizer has a difference of ±45 degrees with respect to the polarization axis of the phase retarder.

3. The organic light emitting display device according to claim 1, wherein the phase retarder is a $\lambda/4$ retarder.

4. The organic light emitting display device according to claim 1, wherein the linear polarizer includes the liquid crystal compound and the two or more types of dichroic dyes.

5. The organic light emitting display device according to claim 1, wherein the liquid crystal compound and the two or more types of dichroic dyes contained in the linear polarizer are aligned in the horizontal direction and the liquid crystal compound contained in the phase retarder is aligned to form a selected acute angle with the horizontal direction.

6. The organic light emitting display device according to claim 1, wherein the two or more types of dichroic dyes of the linear polarizer are configured with a higher density than the liquid crystal compound.

7. The organic light emitting display device according to claim 1, wherein the two or more types of dichroic dyes include a high alignment dichroic dye and a low alignment dichroic dye, and the high alignment dichroic dye has a concentration gradient in which a high concentration is present in a lower portion of the linear polarizer and the low alignment dichroic dye has a concentration gradient in which a high concentration is present in an upper portion of the linear polarizer.

8. The organic light emitting display device according to claim 7, wherein the high alignment dichroic dye has a higher density than the low alignment dichroic dye.

9. The organic light emitting display device according to claim 7, wherein the linear polarizer includes a first part in which the high alignment dichroic dye is contained with highest concentration and a second part in which the low alignment dichroic dye is contained with highest concentration and a boundary of the first part and the second part is a location in which the concentrations of the high alignment dichroic dye and the low alignment dichroic dye are equal.

10. The organic light emitting display device according to claim 1, wherein the liquid crystal compound and the dichroic dye contained in the linear polarizer are aligned by first linearly polarized ultraviolet (LPUV) light.

11. The organic light emitting display device according to claim 10, wherein the liquid crystal compound included in the phase retarder is aligned by second LPUV light.

12. The organic light emitting display device according to claim 11, wherein the first LPUV light is UV light which is linearly polarized at 0 degrees or 90 degrees and the second LPUV light is UV light which is linearly polarized at 45 degrees or 135 degrees.

13. The organic light emitting display device according to claim 1, wherein the multi-functional layer is formed by irradiating first linearly polarized ultraviolet (LPUV) light on one surface thereof and irradiating second LPUV light on another surface thereof and thermally curing by a baking process.

14. The organic light emitting display device according to claim 13, wherein on one surface on which the first LPUV light is irradiated, the liquid crystal compound and the two or more types of dichroic dyes are present and the liquid crystal compound and the two or more types of dichroic dyes are thermally cured to form the linear polarizer.

15. The organic light emitting display device according to claim 14, wherein the liquid crystal compound is present on the another surface on which the second LPUV light is irradiated and the liquid crystal compound is thermally cured to form a phase retarder.

16. The organic light emitting display device according to claim 15, wherein the linear polarizer and the phase retarder are cured together while preforming the baking process.

* * * * *